(12) United States Patent
Jachmann et al.

(10) Patent No.: US 10,359,485 B2
(45) Date of Patent: Jul. 23, 2019

(54) NUCLEAR MAGNETIC RESONANCE TOOL WITH PROJECTIONS FOR IMPROVED MEASUREMENTS

(71) Applicant: Halliburton Energy Services, Inc., Houston, TX (US)

(72) Inventors: Rebecca Jachmann, Houston, TX (US); Sunghua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 99 days.

(21) Appl. No.: 15/531,608

(22) PCT Filed: Dec. 30, 2014

(86) PCT No.: PCT/US2014/072721
§ 371 (c)(1),
(2) Date: May 30, 2017

(87) PCT Pub. No.: WO2016/108834
PCT Pub. Date: Jul. 7, 2016

(65) Prior Publication Data
US 2018/0252784 A1    Sep. 6, 2018

(51) Int. Cl.
*G01R 33/38* (2006.01)
*G01R 33/34* (2006.01)
*G01V 3/32* (2006.01)

(52) U.S. Cl.
CPC ... *G01R 33/3808* (2013.01); *G01R 33/34053* (2013.01); *G01V 3/32* (2013.01)

(58) Field of Classification Search
CPC . G01R 33/3808; G01R 33/34053; G01V 3/32

USPC .......................................................... 324/303
See application file for complete search history.

(56) References Cited

U.S. PATENT DOCUMENTS

| | | |
|---|---|---|
| 2,761,103 A | 8/1956 | Doll |
| 2,782,364 A | 2/1957 | Shuler et al. |
| 3,052,835 A | 9/1962 | Dunlap et al. |
| 4,717,877 A | 1/1988 | Taicher et al. |

(Continued)

FOREIGN PATENT DOCUMENTS

| | | |
|---|---|---|
| EA | 006178 B1 | 10/2005 |
| RU | 2104566 C1 | 2/1998 |
| RU | 2230345 C1 | 6/2004 |

OTHER PUBLICATIONS

International Search Report and Written Opinion issued in related PCT Application No. PCT/US2014/072721 dated Sep. 14, 2015, 13 pages.

(Continued)

*Primary Examiner* — Melissa J Koval
*Assistant Examiner* — Rahul Maini
(74) *Attorney, Agent, or Firm* — Jason Sedano; Baker Botts L.L.P.

(57) ABSTRACT

An example method for generating measurements using a downhole tool may comprise generating a magnetic field using a magnetic field source coupled to a tool body. An electromagnetic signal may be transmitted from an antenna coupled to the tool body and around which at least one radial projection is positioned and tilted with respect to a longitudinal axis of the tool body. The method may also include receiving a response to the transmitted electromagnetic signal.

20 Claims, 5 Drawing Sheets

(56) References Cited

U.S. PATENT DOCUMENTS

| | | | |
|---|---|---|---|
| 5,280,243 A | | 1/1994 | Miller |
| 5,710,511 A | | 1/1998 | Taicher et al. |
| 5,979,570 A | * | 11/1999 | McLoughlin ............ E21B 47/18 175/24 |
| 6,012,537 A | * | 1/2000 | Rountree ................... E21B 4/02 166/242.1 |
| 6,069,479 A | | 5/2000 | Taicher et al. |
| 6,838,876 B2 | | 1/2005 | Kruspe et al. |
| 6,956,372 B2 | | 10/2005 | Masak et al. |
| 7,150,316 B2 | | 12/2006 | Itskovich |
| 7,463,027 B2 | * | 12/2008 | Prammer ................. G01V 3/32 324/303 |
| 7,986,145 B2 | | 7/2011 | Sorbier et al. |
| 8,082,987 B2 | * | 12/2011 | Chesnutt ............. E21B 17/1014 166/241.1 |
| 8,427,164 B2 | | 4/2013 | Fang et al. |
| 2003/0155915 A1 | | 8/2003 | Kruspe et al. |
| 2011/0006775 A1 | | 1/2011 | Fang et al. |
| 2011/0257886 A1 | | 10/2011 | Itskovich et al. |
| 2014/0306853 A1 | | 10/2014 | Purkis et al. |

OTHER PUBLICATIONS

"MR eXplorer—Magnetic Resonance Logging Service", Baker Hughes brochure, 2010, 12 pages.
International Preliminary Report on Patentability issued in related Application No. PCT/US2014/072721, dated Jul. 13, 2017 (10 pages).
Search Report issued in related Russian Application No. 2017118457, dated May 15, 2018 (2 pages, not translated).

* cited by examiner

FIG. 6

NUCLEAR MAGNETIC RESONANCE TOOL WITH PROJECTIONS FOR IMPROVED MEASUREMENTS

CROSS-REFERENCE TO RELATED APPLICATION

The present application is a U.S. National Stage Application of International Application No. PCT/US2014/072721 filed Dec. 30, 2014, which is incorporated herein by reference in its entirety for all purposes.

BACKGROUND

The present disclosure relates generally to well drilling operations and, more particularly, to a nuclear magnetic resonance (NMR) tool with projections for improved measurements.

Hydrocarbons, such as oil and gas, are commonly obtained from subterranean formations that may be located onshore or offshore. The development of subterranean operations and the processes involved in removing hydrocarbons from a subterranean formation are complex. Typically, subterranean operations involve a number of different steps such as, for example, drilling a wellbore at a desired well site, treating the wellbore to optimize production of hydrocarbons, and performing the necessary steps to produce and process the hydrocarbons from the subterranean formation. Measurements of the subterranean formation may be made throughout the operations to characterize the formation and aide in making operational decisions. In certain instances, a NMR tool may be used to take measurements of the formation using one or more antennas. These antennas may generate eddy currents in conductive media surrounding the tool that introduce noise into the measurements and reduce their accuracy.

FIGURES

Some specific exemplary embodiments of the disclosure may be understood by referring, in part, to the following description and the accompanying drawings.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components. It may also include one or more interface units capable of transmitting one or more signals to a controller, actuator, or like device.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Illustrative embodiments of the present disclosure are described in detail herein. In the interest of clarity, not all features of an actual implementation may be described in this specification. It will of course be appreciated that in the development of any such actual embodiment, numerous implementation-specific decisions are made to achieve the specific implementation goals, which will vary from one implementation to another. Moreover, it will be appreciated that such a development effort might be complex and time-consuming, but would, nevertheless, be a routine undertaking for those of ordinary skill in the art having the benefit of the present disclosure.

To facilitate a better understanding of the present disclosure, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot or the like. "Measurement-while-drilling" ("MWD") is the term generally used for measuring conditions downhole concerning the movement and location of the drilling assembly while the drilling continues. "Logging-while-drilling" ("LWD") is the term generally used for similar techniques that concentrate more on formation parameter measurement. Devices and methods in accordance with certain embodiments may be used in one or more of wireline (including wireline, slickline, and coiled tubing), downhole robot, MWD, and LWD operations.

The terms "couple" or "couples" as used herein are intended to mean either an indirect or a direct connection. Thus, if a first device couples to a second device, that connection may be through a direct connection or through an indirect mechanical or electrical connection via other devices and connections. Similarly, the term "communicatively coupled" as used herein is intended to mean either a direct or an indirect communication connection. Such connection may be a wired or wireless connection such as, for example, Ethernet or LAN. Such wired and wireless connections are well known to those of ordinary skill in the art and will therefore not be discussed in detail herein. Thus, if a first device communicatively couples to a second device, that connection may be through a direct connection, or through an indirect communication connection via other devices and connections.

Figures 1, 2:
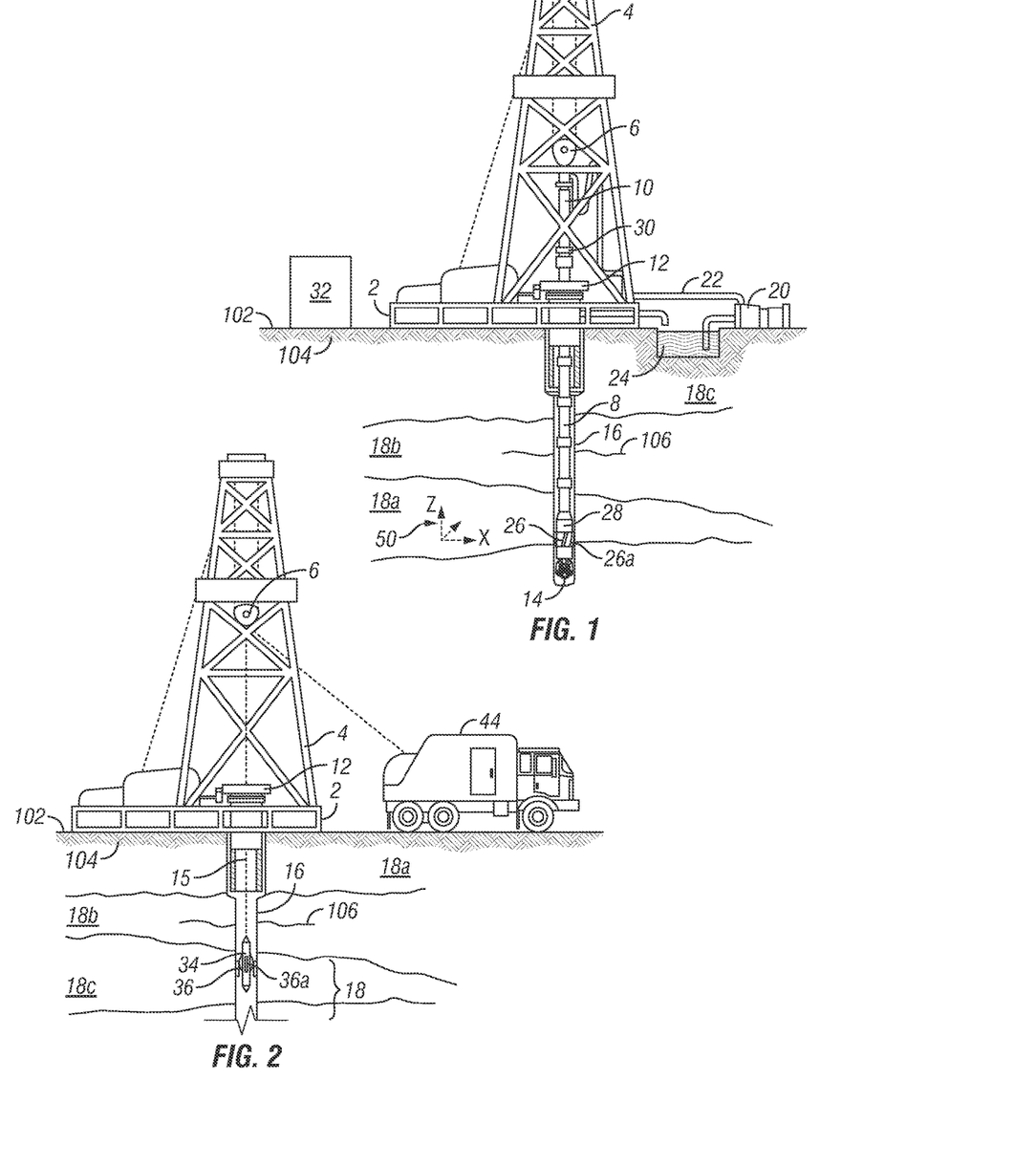
FIG. 1 is a diagram showing an illustrative logging while drilling environment, according to aspects of the present disclosure.
FIG. 2 is a diagram showing an illustrative wireline logging environment, according to aspects of the present disclosure.

FIG. 1 is a diagram of a subterranean drilling system 100, according to aspects of the present disclosure. The drilling system 100 comprises a drilling platform 2 positioned at the surface 102. In the embodiment shown, the surface 102 comprises the top of a formation 104 containing one or more rock strata or layers 18a-c, and the drilling platform 2 may be in contact with the surface 102. In other embodiments, such as in an off-shore drilling operation, the surface 102 may be separated from the drilling platform 2 by a volume of water.

The drilling system 100 comprises a derrick 4 supported by the drilling platform 2 and having a traveling block 6 for raising and lowering a drill string 8. A kelly 10 may support the drill string 8 as it is lowered through a rotary table 12. A drill bit 14 may be coupled to the drill string 8 and driven by a downhole motor and/or rotation of the drill string 8 by the rotary table 12. As bit 14 rotates, it creates a borehole 16 that passes through one or more rock strata or layers 18. A pump 20 may circulate drilling fluid through a feed pipe 22 to kelly 10, downhole through the interior of drill string 8, through orifices in drill bit 14, back to the surface via the annulus around drill string 8, and into a retention pit 24. The drilling fluid transports cuttings from the borehole 16 into the pit 24 and aids in maintaining integrity or the borehole 16.

The drilling system 100 may comprise a bottom hole assembly (BHA) coupled to the drill string 8 near the drill bit 14. The BHA may comprise various downhole measurement tools and sensors and LWD and MWD elements, including a NMR tool 26 with at least one tilted, radial projection 26a. As will be described in detail below, the NMR tool 26 may measure a magnetic resonance response of the portion of the formation 104 surrounding the NMR tool 26, which may be used to determine, for example, the porosity and permeability of rock within the formation 104, and to identify the types of fluids trapped within pores of the rock within the formation 104. As will also be described below, the projection 26a may improve the accuracy of magnetic resonance response measurement by reducing the noise introduced into the magnetic resonance response by eddy currents generated by the tool 26.

The tools and sensors of the BHA including the NMR tool 26 may be communicably coupled to a telemetry element 28. The telemetry element 28 may transfer measurements from the NMR tool 26 to a surface receiver 30 and/or to receive commands from the surface receiver 30. The telemetry element 28 may comprise a mud pulse telemetry system, and acoustic telemetry system, a wired communications system, a wireless communications system, or any other type of communications system that would be appreciated by one of ordinary skill in the art in view of this disclosure. In certain embodiments, some or all of the measurements taken at the NMR tool 26 may also be stored within the tool 26 or the telemetry element 28 for later retrieval at the surface 102.

In certain embodiments, the drilling system 100 may comprise an information handling system 32 positioned at the surface 102. The information handling system 32 may be communicably coupled to the surface receiver 30 and may receive measurements from the NMR tool 26 and/or transmit commands to the NMR tool 26 though the surface receiver 30. The information handling system 32 may also receive measurements from the NMR tool 26 when the tool 26 is retrieved at the surface 102. As will be described below, the information handling system 32 may process the measurements to determine certain characteristics of the formation 104, including the location and characteristics of fractures within the formation 104.

At various times during the drilling process, the drill string 8 may be removed from the borehole 16 as shown in FIG. 2. Once the drill string 8 has been removed, measurement/logging operations can be conducted using a wireline tool 34, i.e., an instrument that is suspended into the borehole 16 by a cable 15 having conductors for transporting power to the tool and telemetry from the tool body to the surface 102. The wireline tool 34 may include a NMR tool 36 with at least one radial projection 36a having a similar configuration to NMR tool 26 and radial projection 26a. The NMR tool 36 may be communicatively coupled to the cable 15. A logging facility 44 (shown in FIG. 2 as a truck, although it may be any other structure) may collect measurements from the resistivity logging tool 36, and may include computing facilities (including, e.g., an information handling system) for controlling, processing, storing, and/or visualizing the measurements gathered by the NMR tool 36. The computing facilities may be communicatively coupled to the logging/measurement tool 36 by way of the cable 15. In certain embodiments, the information handling system 32 may serve as the computing facilities of the logging facility 44.

Figure 3:
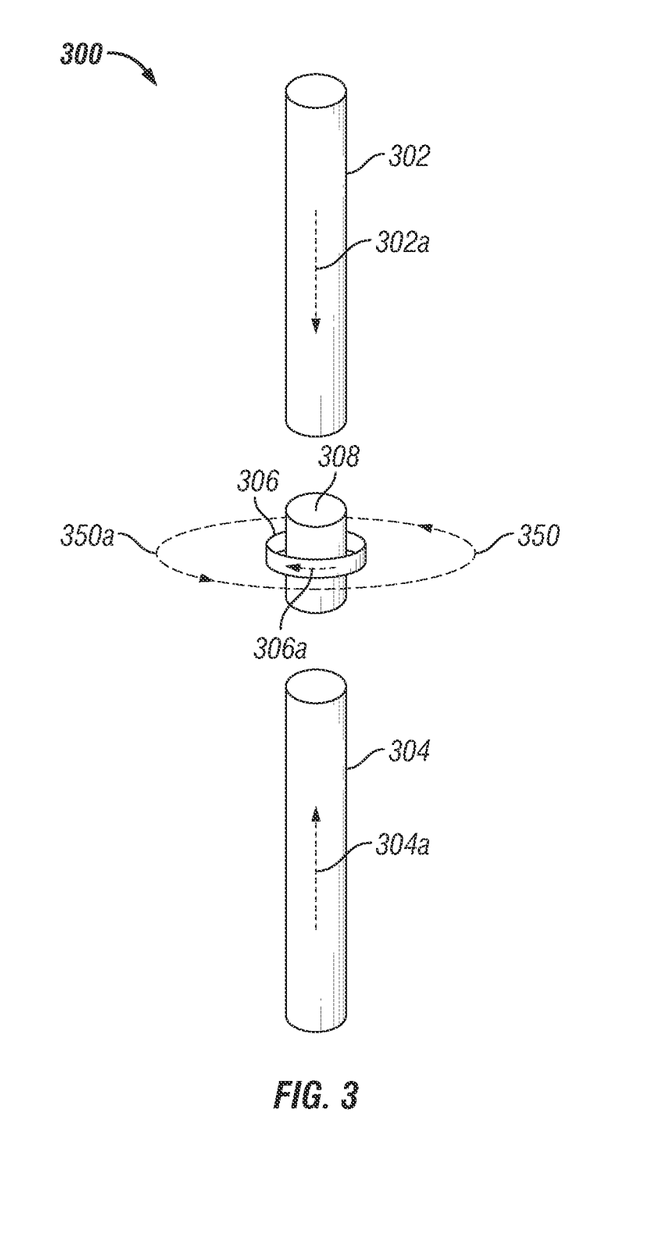
FIG. 3 is a diagram of an example NMR tool, according to aspects of the present disclosure.

FIG. 3 is a diagram illustrating portions of an example NMR tool 300 and an associated eddy current 350 generated by the tool 300, according to aspects of the present disclosure. The tool 300 comprises at least one magnetic field sources 302/304 and at least one antenna 306 capable of receiving and/or transmitting one or more electromagnetic signals. In the embodiment shown, the magnetic field sources 302/304 comprise permanent magnets with a magnetic field orientation indicated by arrows 302a/304a. The antenna 306 may comprise a solenoid-type antenna wrapped around a magnetically permeable material 308 that aids in focusing outward an electromagnetic field generated by the antenna 308. Other types and configurations of magnetic field sources and antennas are possible, including "transversal antennas" that generate electromagnetic fields perpendicular to the longitudinal axis of the tool 300.

In use, the magnetic field sources 302/304 may generate a magnetic field in the media surrounding the tool 300, such as the borehole and formation surrounding the tool 300 when the tool 300 is used in a drilling operation similar to the ones described above. Alternating current may then be supplied to the antenna 306 in the direction indicated by arrow 306a, causing it to transmit an electromagnetic signal into the media surrounding the tool that is within the magnetic field. The transmitted electromagnetic signal may be absorbed by the nuclei of atoms in the media subject to the magnetic field generated by the magnetic field sources 302/304. The oscillations of the coherent magnetic field, the magnetization, created by the spins have a specific resonance frequency which depends on the strength of the magnetic field and the magnetic properties of the isotope of the atoms. The antenna 306 or another antenna in the tool may measure the magnetic resonance response of the excited magnetization within the formation to facilitate a determination of certain characteristic of the surrounding formation. These characteristics are commonly the relaxation rates of the magnetization to return to thermal equilibrium.

The electromagnetic signal transmitted from the antenna 306 also may cause an eddy current 350 to form in any electrically conductive media surrounding the tool 300. In a downhole environment, the eddy current 350 may be generated in conductive fluids (e.g., drilling fluids) surrounding the tool 300 in a borehole. The eddy current 350 may flow around the antenna 306 following the shape of and in a plane generally parallel to the plane of the antenna 306, but in a direction opposite the flow of current through the antenna 306, as indicated by arrow 350a. The eddy current 350 may generate a secondary electromagnetic field that is measured by the antenna 306 along with magnetic resonance response of the formation. This functions to impart noise into the magnetic resonance response measurement that reduces its accuracy. The eddy current also reduces the efficiency of the tool 300, because it requires more power to be expended generating the Radio Frequency (RF) field.

In typical NMR tools used in wireline applications, fluid excluders are used to displace the drilling fluid surrounding the antenna, thereby reducing the amount of drilling fluid in which an eddy current can be generated, which in turn reduces the strength of the secondary electromagnetic field and improves the signal-to-noise ratio (SNR) of the measured magnetic resonance response. These fluid excluders take the form of a sleeve that encases the portion of the tool containing the antenna and magnets. The sleeve typically is cylindrical with an outer diameter greater than the diameter of the tool. This has the effect of limiting the size of the annulus between the antenna and the borehole wall and thereby limiting the amount of drilling fluid that can be located within that annulus at a given time. The reduction of the SNR of the measured magnetic resonance response is generally linear with respect to the percentage of the drilling fluid displaced from the annulus. A similar concept is theoretically valid for LWD/MWD NMR tools. These sleeves have limitations, however, because restricting all fluid flow past the tool is problematic.

Figures 4A, 4B:
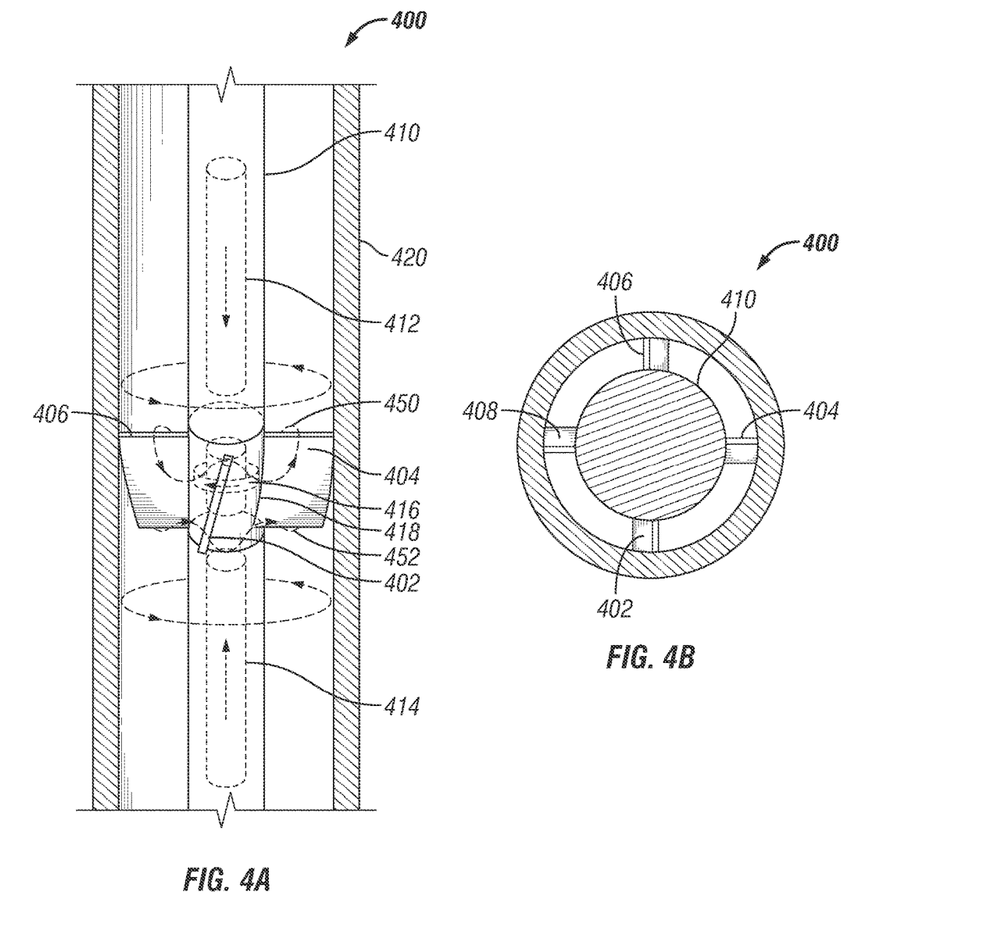
FIGS. 4A and 4B are diagram of an example NMR tool with at least one radial projection, according to aspects of the present disclosure.

According to aspects of the present disclosure, an NMR tool with at least one tilted, radial projection proximate the antenna may improve the SNR ratio of the measured magnetic resonance response by disrupting an eddy current generated in the conductive media, rather than displacing the conductive media from around the tool, while facilitating fluid flow past the tool. One example NMR tool 400 incorporating aspects of the present disclosure is illustrated in FIGS. 4A and 4B. The NMR tool 400 comprises a cylindrical tool body 410 to which magnetic field sources 412 and 414 and antenna 416 are coupled. The antenna 416 comprises a solenoid antenna arranged coaxially with the tool body 410 and magnetic field source 404 and 406. Four non-conductive, planar, radial projections 402-408 are equally spaced around the circumference of tool body 410 proximate the antenna 416 and tilted with respect to a longitudinal axis 480 of the tool body 410. In particular, the projections 402-408 comprise fins that at least partially intersect the plane of the antenna 416 and are tilted at an angle 490 with respect to the longitudinal axis 480 of the tool body 410. The projections may be made of any non-conductive material, including fiberglass, polyether ether ketone (PEEK), ceramic, or rubber. Other numbers, shapes, orientations, and sizes of projections are possible.

Given that the antenna 406 is coaxial with the tool body 410, the tilted orientation of the projections 402-408 with respect to the longitudinal axis 480 of the tool body 410 means that the projections 406 are also tilted with respect to the plane of the antenna 406 by the angle 490. Such an orientation is not required, however, because the orientation of the antenna 406 with respect to the tool body 410 can change, and the projections are not required to be at any particular angle with respect to the plane of the antenna 406. For example, the antenna 406 may be tilted with respect to the tool body 410 in certain instances, and the projections 402-408 may be perpendicular with respect to the plane of the antenna 406.

The projections 402-408 may be coupled directly or indirectly to the tool body 410. In the embodiment shown, the projections 402-408 may be integrally formed with or otherwise attached to a sleeve 418 of the tool 400 that radially surrounds the antenna 406. The sleeve 418 may be coupled to the tool body 410 and function to protect the antenna 406 from downhole conditions. In other embodiments, the projections may be integrally formed with or otherwise directly attached to the tool body 410. In certain embodiments, the projections 402-408 may be removably coupled to the sleeve 418 or the tool body 410, such that they may be easily replaced in the case of wear. In another embodiment, the projections 402-408 may be coupled to a stabilizer of the tool 400.

In certain embodiments, the projections 402-408 may be rotatable with respect to the tool body 410. This may facilitate drilling fluid flow through the projections 402-408. In certain embodiments, the sleeve 418 to which the projection 402-408 are coupled may be coupled to the tool body 410 through a plurality of bearings that allow the sleeve 418 to rotate with respect to the tool body 410. As the tool is positioned downhole, the flow of drilling fluid past the tool 400 may impart a rotational force on the projections 402-408. This rotational force may, in turn, cause the sleeve 418 and the projections 402-408 coupled thereto to rotate with respect to the tool body 400.

In the embodiment shown, the tool 400 is positioned within a borehole 420 within a formation 422. The projections 402-408 may extend radially from the tool body 410 such that they contact or are in close proximity to the wall of the borehole 420. The projections 402-408 may at least partially define annular segments surrounding the tool body 410 through which drilling fluid may flow axially with respect to the tool body 410. Because the projections 402-408 may be made of non-conductive material, they may interrupt or displace the shape and flow of eddy currents generated by the antenna 406. In the embodiment shown, rather than flowing in an annular ring around the tool 410 following the shape of the antenna 406, the eddy currents 450 and 452 generated by the antenna 406 are forced to flow around the non-conductive radial projections 402-408, reducing the strength of the eddy currents 450 and 452 and the resulting secondary electromagnetic fields. Accordingly, the resulting magnetic resonance response measurement at the tool 410 will have a higher SNR.

Although the projections 402-408 are the same size and all contact or are in close proximity to the wall of the borehole 420, in other embodiments, some or all of the projections 402-408 may have different sizes and some or all of the projections 402-408 may not contact the wall of the borehole 420. For example, the projections 402-408 may alternate in size such that every other projection 402-408 around the circumference of the tool 400 does not contact the wall of the borehole 420. This may allow for the tool 400 to be centered within the borehole while maximizing the flow of drilling fluid past the tool 400.

Figure 5A:
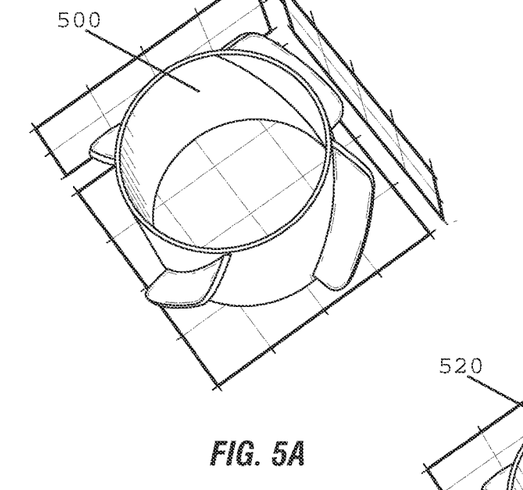
FIG. 5 is a diagram of example radial projections, according to aspects of the present disclosure.
Figure 5B:
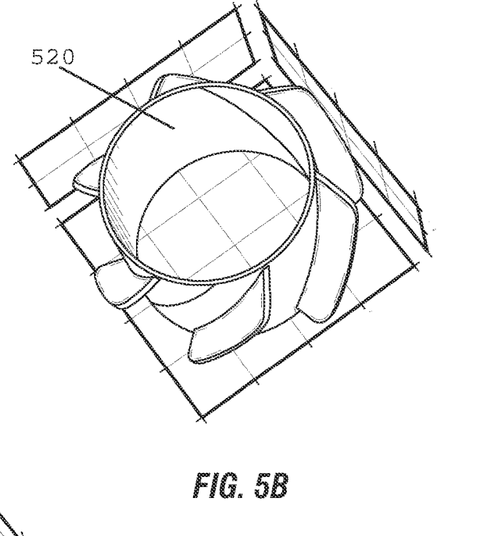
Figure 5C:
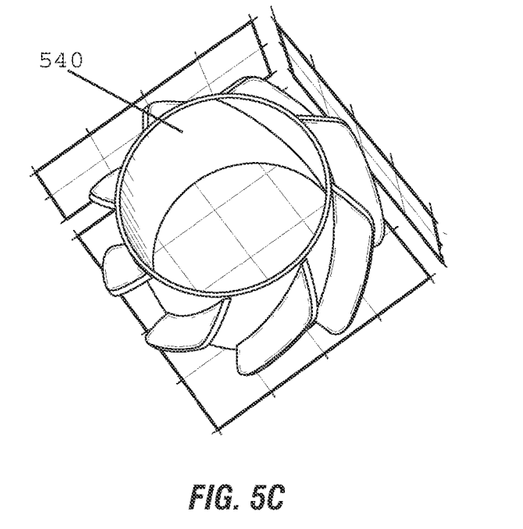

In certain embodiments, the number of tilted, radial projections may be varied based on the SNR required by the tool. FIG. 5 is a diagram of example sleeves 500, 520, and 540 with different numbers of tilted radial projections coupled thereto, according to aspects of the present disclosure. In the embodiment shown, the projections are tilted with respect to the longitudinal axis of the corresponding sleeves 500, 520, and 540, which will be arranged coaxially with the tool bodies of the tools to which the sleeves are coupled. As described above, each of the projections may comprise non-conductive materials, which may function to at least partially define annular segments that disrupt eddy current attempting to flow there through. The reduction in SNR associated with each of the sleeves 500, 520, and 540 may positively correlate with the number of disruptions, i.e., the number of tilted, radial projections.

In the embodiment shown, all of the tilted radial projections are tilted at the same angle with respect to a corresponding antenna and/or a tool body. In other embodiments, the tilted, radial projections on the sleeves 500, 520, and 540 may be tilted at various different angles that may depend, in part, on the orientation of the corresponding antenna with respect to the tool body, and how the projections are mounted on the tool body with respect to the placement of the antenna. Additionally, it may be possible that the tilted radial projections on a single sleeve or tool may have different tilt angles with respect to a single antenna.

Figure 6:
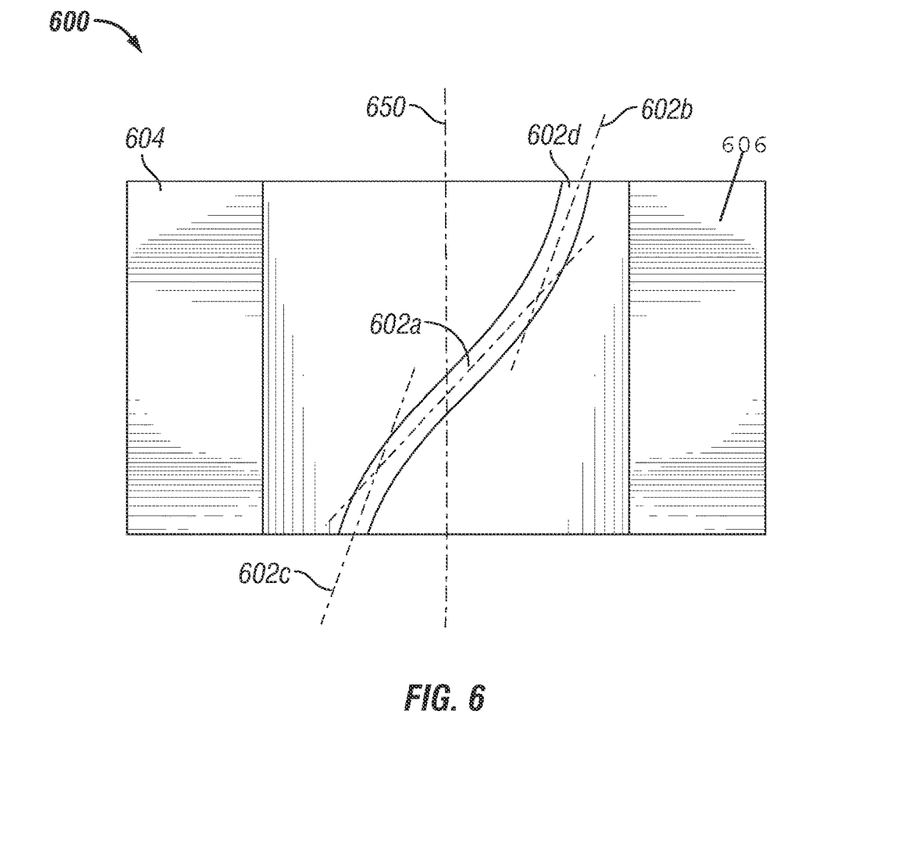
FIG. 6 is a diagram of an example sleeve, according to aspects of the present disclosure.

FIG. 6 is a diagram of another example sleeve 600 comprising tilted, radial projections, according to aspects of the present disclosure. In the embodiment shown, the projections 602-604 are all tilted with respect to the longitudinal axis 650 of the sleeve 600, but the tilt angle of each of the projections 602-604 may be non-uniform across its length. Projection 602, for example, comprises at least three portions 602a-c that are tilted at different angles with respect to the longitudinal axis 650 of the sleeve 600. The tilt angle on each of the portions 602a-c of sleeve 602 may be designed to facilitate fluid flow past the sleeve, such as the blade of a fan facilitates the flow of air. The tilt angles across the length of the projection 602 may be gradient and gradually change over the length, as shown, or may comprise sharp transitions at identifiable transition points between portions of the projection 602. Additionally, it may be possible for portions of a projection, particular the end portions, to approach a perpendicular angle with respect to the longitudinal axis of the sleeve and/or tool body and still be considered tilted within the scope of this disclosure.

According to aspects of the present disclosure, an example downhole tool includes a tool body and a magnetic field source coupled to the tool body. An antenna also may be coupled to the tool body. The tool may include a radial projection from the tool body proximate the antenna and tilted with respect to a longitudinal axis of the tool body.

In certain embodiments, the radial projection comprises one of a plurality of radial projections spaced around the circumference of the tool body. The radial projection may be coupled to a sleeve axially aligned with the antenna with respect to the tool body. The radial projection may be removably coupled to one of the tool body and a sleeve axially aligned with the antenna with respect to the tool body. The radial projection may comprise a non-conductive material. In certain embodiments, the non-conductive material comprises at least one of fiberglass, polyether ether ketone, ceramic, and rubber. The radial projection from the tool body proximate the antenna may at least partially intersect a plane of the antenna.

In any of the embodiments described in the preceding two paragraphs, the radial projection may comprise a tilt angle with respect to the longitudinal axis of the tool body. In certain embodiments, the tilt angle is non-uniform across a length of the projection. In any of the embodiments described in the preceding two paragraphs, the antenna may comprise a solenoid antenna.

According to aspects of the present disclosure, an example method for generating measurements using a downhole tool may comprise generating a magnetic field using a magnetic field source coupled to a tool body. An electromagnetic signal may be transmitted from an antenna coupled to the tool body and around which at least one radial projection is positioned and tilted with respect to a longitudinal axis of the tool body. The method may also include receiving a response to the transmitted electromagnetic signal.

In certain embodiments, the at least one radial projection extends from the tool body. In certain embodiments, the at least one radial projection is coupled to a sleeve axially aligned with the antenna with respect to the tool body. In certain embodiments, the at least one radial projection is removably coupled to one of the tool body and a sleeve axially aligned with the antenna with respect to the tool body. In certain embodiments, the at least one radial projection comprises a non-conductive material. In certain embodiments, the non-conductive material comprises at least one of fiberglass, polyether ether ketone, ceramic, and rubber. In certain embodiments, the at least one radial projection from the tool body proximate the antenna at least partially intersects a plane of the antenna.

In any of the embodiments described in the preceding two paragraphs, the radial projection may comprise a tilt angle with respect to the longitudinal axis of the tool body. The tilt angle may be non-uniform across a length of the projection. In any of the embodiments described in the preceding two paragraphs, receiving the response to the transmitted electromagnetic signal may comprise disrupting with the at least one radial projection an eddy current generated around the tool by the transmitted electromagnetic signal.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee. The indefinite articles "a" or "an," as used in the claims, are defined herein to mean one or more than one of the element that it introduces.

What is claimed is:

1. A downhole tool, comprising
a tool body;
a first magnetic field source and a second magnetic field source coupled to the tool body, wherein the first magnetic field source and the second magnetic field source generate a magnetic field in a formation surrounding the downhole tool;
an antenna coupled to and arranged coaxially with the tool body, wherein the antenna is axially aligned between the first magnetic field source and the second magnetic field source, wherein a first magnetic field orientation of the first magnetic field source and a second magnetic field orientation of the second magnetic field source are directed along the tool body, wherein an alternating current supplied to the antenna causes the antenna to transmit an electromagnetic signal into the formation surrounding the downhole tool that is within the magnetic field, wherein the electromagnetic signal causes one or more eddy currents to form in the formation surrounding the downhole tool, and wherein the antenna measures a magnetic resonance response of an excited magnetization within the formation; and
a radial projection from the tool body proximate the antenna and tilted with respect to a longitudinal axis of the tool body, wherein the radial projection is rotatable with respect to the tool body, and wherein the radial projection interrupts a shape and a flow of the one or more eddy currents which reduces a strength of the one or more eddy currents and one or more resulting electromagnetic fields to improve a signal-to-noise ratio of the measured magnetic resonance response.

2. The downhole tool of claim 1, wherein the radial projection comprises one of a plurality of radial projections spaced around the circumference of the tool body.

3. The downhole tool of claim 1, wherein the radial projection is coupled to a sleeve axially aligned with the antenna with respect to the tool body.

4. The downhole tool of claim 1, wherein the radial projection is removably coupled to one of the tool body and a sleeve axially aligned with the antenna with respect to the tool body.

5. The downhole tool of claim 1, wherein the radial projection comprises a non-conductive material.

6. The downhole tool of claim 5, wherein the non-conductive material comprises at least one of fiberglass, polyether ether ketone, ceramic, and rubber.

7. The downhole tool of claim 1, wherein the radial projection from the tool body proximate the antenna at least partially intersects a plane of the antenna.

8. The downhole tool of claim 1, wherein the radial projection comprises a tilt angle with respect to the longitudinal axis of the tool body.

9. The downhole tool of claim 8, wherein the tilt angle is non-uniform across a length of the projection.

10. The downhole tool of claim 1, wherein the antenna comprises a solenoid antenna.

11. A method for generating measurements using a downhole tool, comprising
generating a magnetic field in a formation surrounding the downhole tool using a first magnetic field source and a second magnetic field source coupled to a tool body;
transmitting an electromagnetic signal within the magnetic field from an antenna coupled to and arranged coaxially with the tool body and around which at least one radial projection is positioned and tilted with respect to a longitudinal axis of the tool body, wherein an alternating current supplied to the antenna causes the antenna to transmit the electromagnetic signal into the formation surrounding the downhole tool, and wherein the radial projection is rotatable with respect to the tool body, wherein the antenna is axially aligned between the first magnetic field source and the second magnetic field source, and wherein a first magnetic field orientation of the first magnetic field source and a second magnetic field orientation of the second magnetic field source are directed along the tool body;
forming one or more eddy currents in the formation surrounding the downhole tool based on the electromagnetic signal;
interrupting, by the radial projection, a shape and a flow of the one or more eddy currents to reduce a strength of the one or more eddy currents and one or more resulting electromagnetic fields;
receiving a response to the transmitted electromagnetic signal; and
measuring, by the antenna, a magnetic resonance response of an excited magnetization with the formation, wherein interrupting the shape and the flow of the one or more eddy currents and the one or more resulting electromagnetic fields improves a signal-to-noise ratio of the measured magnetic resonance response.

12. The method of claim 11, wherein the at least one radial projection extends from the tool body.

13. The method of claim 12, wherein the at least one radial projection is coupled to a sleeve axially aligned with the antenna with respect to the tool body.

14. The method of claim 12, wherein the at least one radial projection is removably coupled to one of the tool body and a sleeve axially aligned with the antenna with respect to the tool body.

15. The method of claim 12, wherein the at least one radial projection comprises a non-conductive material.

16. The method of claim 15, wherein the non-conductive material comprises at least one of fiberglass, polyether ether ketone, ceramic, and rubber.

17. The method of claim 12, wherein the at least one radial projection from the tool body proximate the antenna at least partially intersects a plane of the antenna.

18. The method of claim 11, wherein the radial projection comprises a tilt angle with respect to the longitudinal axis of the tool body.

19. The method of claim 18, wherein the tilt angle is non-uniform across a length of the projection.

20. The method of claim 11, wherein the radial projection is perpendicular with respect to a plane of the antenna.

* * * * *

UNITED STATES PATENT AND TRADEMARK OFFICE
CERTIFICATE OF CORRECTION

PATENT NO. : 10,359,485 B2  
APPLICATION NO. : 15/531608  
DATED : July 23, 2019  
INVENTOR(S) : Rebecca Jachmann and Songhua Chen Page 1 of 1

It is certified that error appears in the above-identified patent and that said Letters Patent is hereby corrected as shown below:

On the Title Page

Item (72) under "Inventors":  
Delete "Sunghua Chen, Katy, TX (US)" and insert --Songhua Chen, Katy, TX (US)--

Signed and Sealed this  
Twenty-third Day of June, 2020

Andrei Iancu  
*Director of the United States Patent and Trademark Office*